United States Patent
Sengoku

(10) Patent No.: US 8,004,046 B2
(45) Date of Patent: Aug. 23, 2011

(54) SEMICONDUCTOR DEVICE AND METHOD FOR FABRICATING THE SAME

(75) Inventor: Naohisa Sengoku, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/712,688

(22) Filed: Feb. 25, 2010

(65) Prior Publication Data

US 2010/0148281 A1   Jun. 17, 2010

Related U.S. Application Data

(63) Continuation of application No. PCT/JP2009/000827, filed on Feb. 25, 2009.

(30) Foreign Application Priority Data

Jun. 24, 2008   (JP) .................................. 2008-164892

(51) Int. Cl.
*H01L 21/70*   (2006.01)
(52) U.S. Cl. ........................................ 257/369; 438/592
(58) Field of Classification Search .................. 257/412, 257/413, 369, 915, E29.128; 438/592, 199
See application file for complete search history.

(56) References Cited

U.S. PATENT DOCUMENTS

| | | | |
|---|---|---|---|
| 6,509,254 B1 | 1/2003 | Matsumoto et al. | |
| 7,429,777 B2 * | 9/2008 | Tsuchiya et al. | 257/412 |
| 2005/0186792 A1 | 8/2005 | Takahashi | |
| 2006/0192258 A1 | 8/2006 | Tsuchiya et al. | |
| 2007/0257302 A1 | 11/2007 | Kang et al. | |
| 2008/0280405 A1 | 11/2008 | Tsuchiya et al. | |

FOREIGN PATENT DOCUMENTS

| | | |
|---|---|---|
| JP | 05-206461 | 8/1993 |
| JP | 2001-127158 | 5/2001 |
| JP | 2001-274391 | 10/2001 |
| JP | 2005-236120 | 9/2005 |
| JP | 2006-237372 | 9/2006 |
| JP | 2007-088122 | 4/2007 |

* cited by examiner

*Primary Examiner* — Mark Prenty
(74) *Attorney, Agent, or Firm* — McDermott Will & Emery LLP

(57) ABSTRACT

A semiconductor device has a gate insulating film formed on a semiconductor substrate, a second gate electrode portion of a gate electrode including a TiN film and a polysilicon film that are successively formed on the gate insulating film, and an interlayer insulating film formed on the semiconductor substrate so as to cover the gate electrode. A contact formed to extend through the interlayer insulating film and the polysilicon film is directly connected to the TiN film.

9 Claims, 12 Drawing Sheets

SEMICONDUCTOR DEVICE AND METHOD FOR FABRICATING THE SAME

CROSS-REFERENCE TO RELATED APPLICATION

This is a continuation of PCT International Application PCT/JP2009/000827 filed on Feb. 25, 2009, which claims priority to Japanese Patent Application No. 2008-164892 filed on Jun. 24, 2008. The disclosures of these applications including the specifications, the drawings, and the claims are hereby incorporated by reference in its entirety.

BACKGROUND

The present disclosure relates to a semiconductor device having a metal gate electrode and a method for fabricating the same.

Referring to FIGS. 19A-19F, a description will be given to a method for forming a metal-inserted polysilicon stack (so-called MIPS) structure in which a metal material and polysilicon are laminated and which is among metal gate structures in conventional metal insulator semiconductor (MIS) transistors (see, e.g., Patent Document 1).

First, as shown in FIG. 19A, an isolation film 102 formed of shallow trench isolation (STI) or the like is selectively formed in an upper portion of a semiconductor substrate 101 made of silicon to partition the semiconductor substrate 101 into an N-type field effect transistor (NFET) formation region 50N and a P-type field effect transistor (PFET) formation region 50P. Then, impurity implantation for threshold (Vt) control and a heat treatment for activating implanted impurities are performed. Subsequently, a gate insulating film 103 is formed over the entire surface of the semiconductor substrate 101. Subsequently, over the entire surface of the formed gate insulating film 103, a titanium nitride (TiN) film 104 is deposited which has a high work function, and is effective for the operation characteristics of the PFET. Thereafter, the portion of the deposited TiN film 104 included in the NFET formation region 50N is removed.

Next, as shown in FIG. 19B, a polysilicon film 105 is deposited over the entire surfaces of the NFET formation region 50N and the PFET formation region 50P.

Next, as shown in FIG. 19C, a tungsten (W) film 106, which is a refractory metal, and a silicon nitride (SiN) film 107 are successively deposited over the polysilicon film 105.

Next, as shown in FIG. 19D, the plurality of deposited films are patterned to form a gate electrode 120. Specifically, in the NFET formation region 50N, a first gate electrode portion 120a including the W film 106 and the polysilicon film 105 is formed as the gate electrode 120. In the PFET formation region 50P, a second gate electrode portion 120b including the W film 106, the polysilicon film 105, and the TiN film 104 is formed as the gate electrode 120. Here, there is shown a cross section of the gate electrode 120 along the gate width direction thereof.

Next, as shown in FIG. 19E, a lightly doped drain (LDD) layer is formed by performing extension implantation on the semiconductor substrate 101 using the gate electrode 120 as a mask, and sidewalls 108 are formed on the side surfaces of the gate electrode 120. Then, using the gate electrode 120 and the sidewalls 108 as a mask, source/drain implantation is performed on the semiconductor substrate 101, and a heat treatment for activating the implanted impurity is performed. Thereafter, a nickel (Ni) film is deposited over the entire surface of the semiconductor substrate 101 and predetermined some heat treatment is performed to form a nickel silicide layer 109 on each of source/drain regions.

Next, as shown in FIG. 19F, an interlayer insulating film 110 is deposited over the semiconductor substrate 101, and the upper surface of the deposited interlayer insulating film 110 is planarized. Subsequently, a contact hole is formed in the planarized interlayer insulating film 110 and in the SiN film 107 located on the gate electrode 120 to expose the underlying W film 106. By filling the contact hole with tungsten (W), a contact 111 is formed.

In this manner, a metal gate having the MIPS structure is formed in the PFET formation region 50P, while a polysilicon gate is formed in the NFET formation region 50N.

Patent Document 1: Japanese Laid-Open Patent Publication No. 2007-088122

Patent Document 2: Japanese Laid-Open Patent Publication No. 2001-274391

SUMMARY

However, the foregoing conventional semiconductor device having the metal gate having the MIPS structure presents a problem of a high interface resistance between the TiN film 104 and the polysilicon film 105 in the second gate electrode portion 120b which is the metal gate forming a PFET.

To allow a transistor using a metal gate, which is the PFET here to operate at a high speed, it is required to charge or discharge the gate electrode of the transistor rapidly. To satisfy the requirement, it is necessary to reduce a resistance value in a current path extending from the contact 110 to the TiN film 104 in contact with the gate insulating film 103.

In the prior art example described above, in the current path extending from the contact 110 to the TiN film 104, the polysilicon film 105 is present therebetween. In this case, resistance components are subdivided into a resistance of the polysilicon film 105, a resistance of the TiN film 104, and a contact resistance between the polysilicon film 105 and the TiN film 104. The resistance components also include a resistance of the W film 106, and a contact resistance between the W film 106 and the polysilicon film 105, but it has been known that the resistivity of W is lower than that of TiN, and the contact resistivity between the W film 106 and the polysilicon film 105 can also be reduced (see, e.g., Patent Document 2).

FIG. 20 shows the relationship between a value of the contact resistivity between the polysilicon film 105 and the TiN film 104 and a delay time in the gate electrode 120, which have been calculated by simulation. The delay time is defined here as a time elapsed from 0 sec, which is a moment when a predetermine voltage is applied to the contact 110, until the voltage value of the TiN film 104 has reached 90% of the predetermined applied voltage. It is assumed here that the resistivity of the polysilicon film 105 is 1300 μΩcm, and the resistivity of the TiN film 104 is 200 μΩcm. From the simulation result of FIG. 20, it will be understood that, when a rise time required is assumed to be 1 psec, the contact resistivity should be set to a value of about not more than $1\times10^{-7}$ Ωcm$^2$. Note that the contact resistivity between tungsten and polysilicon and the resistivity of tungsten are ignored here.

However, actual contact resistivity measured between the TiN film 104 and the polysilicon film 105 is found to be about $1\times10^{-5}$ Ωcm$^2$. In this case, the delay time is at least over 10 psec, and therefore the gate metal structure according to the prior art example described above cannot be applied to a semiconductor device which handles a high frequency on a gigahertz level in the operation thereof.

The high resistance at the interface between the polysilicon film 105 and the TiN film 104 will be coming from some surface oxidation of the TiN film 104 at the early stage of the deposition of the polysilicon film 105 on the TiN film 104, the Schottky junction formed between the TiN film 104 and the polysilicon film 105, and the like.

To reduce the value of the contact resistivity between the TiN film 104 and the polysilicon film 105, firstly, some great care during the polysilicon deposition should be needed to prevent the formation of a new film causing high contact resistance between the polysilicon film 105 and the TiN film 104 at least. But theoretically, when the Fermi energy of the gate metal is within the band gap of silicon, the Schottky junction formed between the TiN film 104 and the polysilicon film 105 is inevitable. So to achieve low contact resistance, it is needed to increase the dopant concentration in the polysilicon film 105, thereby reducing the depletion length of the polysilicon which allows tunneling through a Schottky barrier easier.

It is therefore an object of the present invention to solve the conventional problems described above, and provide a semiconductor device including a metal gate having a MIPS structure which allows the semiconductor device to operate at a high speed.

To attain the foregoing object, the present invention provides a semiconductor device with a structure in which a contact electrically connected to a gate electrode and the metal film forming the contact and the metal gate are connected to each other without interposition of a silicon film therebetween.

Specifically, a first semiconductor device according to the present invention includes: a gate insulating film formed on a semiconductor region; a gate electrode including a first metal film and a conductive film made of silicon that are successively formed on the gate insulating film; an insulating film formed on the semiconductor region so as to cover the gate electrode; and a second metal film extending through the insulating film and the conductive film, and directly connected to the first metal film.

The first semiconductor device includes the second metal film extending through the insulating film and the conductive film and directly connected to the first metal film. That is, the second metal film serving as a contact is directly connected to the first metal film without interposition of an interface between the first metal film and silicon which tends to have a high resistance. Therefore, it is possible to implement high-speed operation of the semiconductor device.

A second semiconductor device according to the present invention includes: a gate insulating film formed on a first semiconductor region and a second semiconductor region which have different conductivity types; a first gate electrode including a first conductive film formed on the gate insulating film in the first semiconductor region; a second gate electrode including a first metal film and a second conductive film made of silicon that are successively formed on the gate insulating film in the second semiconductor region; an insulating film formed in the first semiconductor region and the second semiconductor region so as to cover the gate electrode; and a second metal film extending through the insulating film, and connected to the first metal film, wherein the first metal film has a vertical portion protruding upwardly and vertically to the second semiconductor region in a portion of the second semiconductor region to be adjacent to the first semiconductor region, an upper end surface of the vertical portion of the first metal film is exposed from the first conductive film and the second conductive film, and the second metal film is connected to the upper end surface of the vertical portion of the first metal film.

In the second semiconductor device, the first metal film forming a metal gate has the vertical portion protruding upwardly and vertically to the second semiconductor region in the portion of the second semiconductor region to be adjacent to the first semiconductor region. The upper end surface of the vertical portion of the first metal film is exposed from the first conductive film and the second conductive film, and the second metal film is connected to the upper end surface of the vertical portion of the first metal film. As a result, the second metal film serving as a contact is directly connected to the first metal film without interposition of an interface between the first metal film and silicon which tends to have a high resistance. Therefore, it is possible to implement high-speed operation of the semiconductor device.

In the second semiconductor device, the first conductive film is preferably made of silicon.

In the second semiconductor device, the first conductive film is preferably a third metal film.

Preferably, the second semiconductor device further includes: a fourth metal film covering an upper surface of the first conductive film, an upper surface of the second conductive film, and the upper end surface of the vertical portion of the first metal film, wherein the second metal film is preferably electrically connected to the upper end surface of the vertical portion of the first metal film via the fourth metal film.

Preferably, the second semiconductor device further includes: a third conductive film made of silicon and a fourth metal film that are successively formed so as to cover an upper surface of the first conductive film, an upper surface of the second conductive film, and the upper end surface of the vertical portion of the first metal film, wherein the second metal film preferably extends through the fourth metal film and the third conductive film and is directly connected to the upper end surface of the vertical portion of the first metal film.

In this case, the fourth metal film is preferably made of a metal silicide or a refractory metal.

A first method for fabricating a semiconductor device according to the present invention includes the steps of: forming a gate insulating film on a semiconductor region; successively forming a first metal film and a conductive film made of silicon on the gate insulating film; patterning the first metal film and the conductive film to form a gate electrode from the first metal film and the conductive film; forming an insulating film on the semiconductor region to cover the gate electrode therewith; forming a contact hole in the insulating film and the conductive film to expose the first metal film therethrough; and filling the contact hole with a second metal film so as to directly connect the second metal film to the first metal film.

A second method for fabricating a semiconductor device according to the present invention includes the steps of: forming a gate insulating film on a semiconductor substrate having a first semiconductor region and a second semiconductor region which have different conductivity types; selectively forming a first metal film on the gate insulating film in the second semiconductor region; forming a conductive film made of silicon on the gate insulating film in the first semiconductor region and on the first metal film in the second semiconductor region; patterning the conductive film in the first semiconductor region to form therein a first gate electrode from the conductive film, while patterning the conductive film and the first metal film in the second semiconductor region to form therein a second gate electrode from the conductive film and the first metal film; forming an insulating film in the first semiconductor region and the second semiconductor region to cover the first gate electrode and the second gate electrode therewith; forming a contact hole in the insulating film and the conductive film to expose the first metal therethrough; and filling the contact hole with a second metal film so as to directly connect the second metal film to the first metal film.

A third method for fabricating a semiconductor device according to the present invention includes the steps of: a first step of forming a gate insulating film on a semiconductor substrate having a first semiconductor region and a second semiconductor region which have different conductivity types; a second step of selectively forming a first conductive film made of silicon on the gate insulating film in the first semiconductor region; a third step of forming a first metal film to continuously cover an upper surface of the first conductive film in the first semiconductor region, a side surface of the first conductive film to be adjacent to the second semiconductor region, and an upper surface of the gate insulating film in the second semiconductor region therewith; a fourth step of forming a second conductive film made of silicon on the first metal film; a fifth step of polishing the second conductive film to expose the first conductive film and an upper end surface of a portion of the first metal film which is interposed between the first conductive film and the second conductive film and located on the side surface of the first conductive film; a sixth step of patterning the first conductive film in the first semiconductor region to form therein a first gate electrode from the first conductive film, while patterning the second conductive film and the first metal film in the second semiconductor region to form therein a second gate electrode from the second conductive film and the first metal film; a seventh step of forming an insulating film in the first semiconductor region and the second semiconductor region to cover the first gate electrode and the second gate electrode therewith; an eighth step of forming a contact hole in the insulating film to expose the upper end surface of the first metal film therethrough; and a ninth step of filling the contact hole with a second metal film so as to directly connect the second metal film to the upper end surface of the first metal film.

Preferably, the third method for fabricating a semiconductor device further includes, between the first step and the second step: a tenth step of selectively forming a third metal film on the gate insulating film in the first semiconductor region, wherein the sixth step preferably includes patterning the third metal film to form the first gate electrode including the first conductive film and the third metal film.

With the semiconductor device and the method for fabricating the same according to the present invention, it is possible to provide a semiconductor device having a metal gate having a MIPS structure which allows the semiconductor device to operate at a high speed.

DETAILED DESCRIPTION

Embodiment 1

Figure 1:
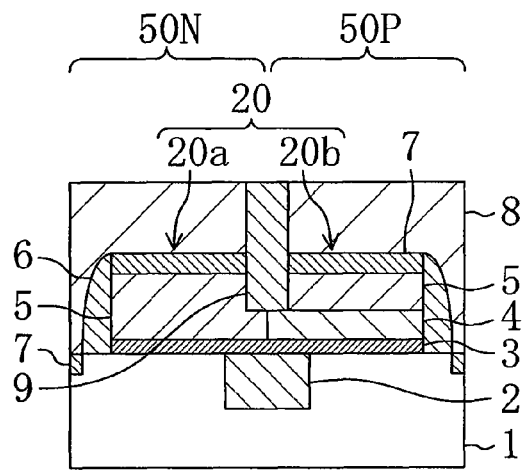
FIG. 1 is a structural cross-sectional view of a semiconductor device according to a first example embodiment.

Referring to the drawings, a first example embodiment will be described.

FIG. 1 shows a cross-sectional structure in the gate width direction of a transistor including a metal gate having a MIPS structure as a semiconductor device according to the first example embodiment.

As shown in FIG. 1, an upper portion of a semiconductor substrate 1 made of silicon (Si) is partitioned by an isolation film 2 formed of shallow trench isolation (STI) or the like into an N-type field effect transistor (NFET) formation region 50N and a P-type field effect transistor (PFET) formation region 50P.

On a principal surface of the semiconductor substrate 1 having the isolation film 2 formed therein, there is formed a gate insulating film 3 including a silicon dioxide ($SiO_2$) film having a thickness of 1.5 nm and a hafnium silicon oxynitride (HfSiON) film having a thickness of 3.0 nm.

On the gate insulating film 3, there is formed a gate electrode 20 extending continuously between the NFET formation region 50N and the PFET formation region 50P. Specifically, in the NFET formation region 50N, a first gate electrode portion 20a is formed which includes a polysilicon film 5 having a thickness of 100 nm, and having a nickel silicide layer 7 formed thereon. In the PFET formation region 50P, there is formed a second gate electrode portion 20b which includes a titanium nitride (TiN) film 4 having a thickness of 10 nm and the polysilicon film 5 having a thickness of 100 nm, and having the nickel silicide layer 7 formed thereon. Note that, in the nickel silicide layer 7, a metal to be silicidized is not limited to nickel (Ni), and there can be used cobalt (Co), titanium (Ti), or the like.

The gate electrode 20 is covered with an interlayer insulating film 8 made of, e.g., silicon dioxide. In a boundary portion between the NFET formation region 50N and the PFET formation region 50P in the gate electrode 20, there is formed a contact 9 by laminating titanium (Ti), titanium nitride (TiN), and tungsten (W). The contact 9 extends through the interlayer insulating film 8, the nickel silicide layer 7, and the polysilicon film 5 to be directly connected to a TiN film 4. The position where the contact 9 is formed is not necessarily limited to the boundary portion between the NFET formation region 50N and the PFET formation region 50P. The contact 9 may be formed at any position where the contact 9 is directly connected to the TiN film 4.

Thus, according to the first example embodiment, the contact 9 extends through the polysilicon film 5 in the second gate electrode portion 20b and is directly connected to the TiN film 4. Consequently, the electronic charge can run easily through the contact 9 to the TiN film 4 without passing through the interface between the polysilicon film 5 and the TiN film 4 which tends to have a high resistance. This allows the PFET to operate at a high speed.

Variation 1 of Embodiment 1

Figure 2:
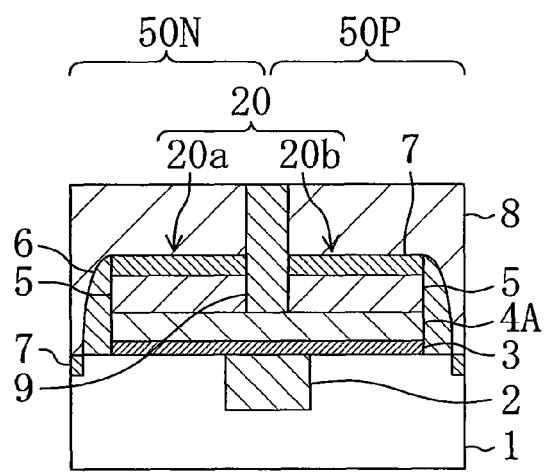
FIG. 2 is a structural cross-sectional view of a semiconductor device according to a first variation of the first example embodiment.

FIG. 2 shows a cross-sectional structure of a semiconductor device according to a first variation of the first example embodiment. A description of the components shown in FIG. 2 which are the same as those shown in FIG. 1 will be omitted by providing the same reference characters.

As shown in FIG. 2, in the first variation, the first gate electrode portion 20a may also be provided with a MIPS structure in which a TiN film 4A is provided between the gate insulating film 3 and the polysilicon film 5, similarly to the second gate electrode portion 20b. In this case, however, the adjustment of the work function value of the gate insulating film 3 in the NFET can be performed through a change of a dopant species for the polysilicon film 5 in the first gate electrode portion 20a or the like. The adjustment of the work function value of the gate insulating film 3 can also be performed by depositing a cap film, e.g., a lanthanum oxide (LaO) film on the gate insulating film 3.

Variation 2 of Embodiment 1

Figure 3:
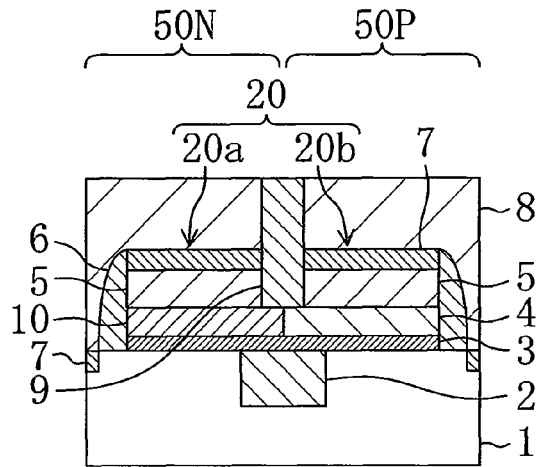
FIG. 3 is a structural cross-sectional view of a semiconductor device according to a second variation of the first example embodiment.

Otherwise, as in a second variation shown in FIG. 3, it is also possible that a tantalum carbide ($Ta_2C$) film 10 may be used as the metal material of the first gate electrode portion 20a, and the TiN film 4 may be used as the metal material of the second gate electrode portion 20b.

Thus, the NFET may also be provided with a MIPS structure. In the case where the same metal material as used for the metal gate forming the PFET is used for the metal gate forming the NFET as in the first variation, a dopant species for the polysilicon film 5, e.g., may be changed appropriately. In the case where a metal material different from that used for the metal gate of the PFET is used for the metal gate forming the NFET, a metal material having an effective work function of not more than 4.6 eV, and effective in improving the operation characteristics of the NFET, such as $Ta_2C$ or TaC, may be used appropriately.

Note that, in the first example embodiment and each of the variations thereof, the nickel silicide layer 7 formed on the polysilicon film 5 forming the gate electrode 20 need not necessarily be formed.

A method for fabricating the semiconductor device having a structure as described above will be described below with reference to the drawings.

FIGS. 4A-4E show cross-sectional structures of the semiconductor device according to the first example embodiment in the order of process steps of the fabrication method therefor.

Figure 4A:
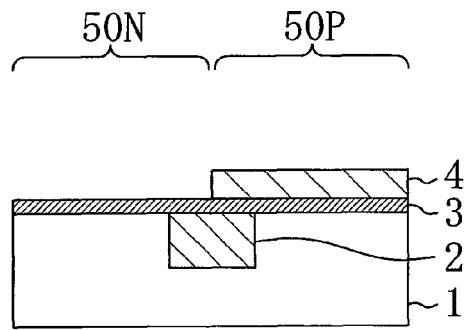
FIGS. 4A-4E are structural cross-sectional views for illustrating a method for fabricating the semiconductor device according to the first example embodiment in the order of process steps.

First, as shown in FIG. 4A, the isolation film 2 formed of STI or the like is selectively formed in the upper portion the semiconductor substrate 1 made of Si to partition the semiconductor substrate 1 into the NFET formation region 50N and the PFET formation region 50P. Then, impurity implantation for threshold (Vt) control using a p-type impurity is performed on the semiconductor substrate 1 in the NFET formation region 50N, while impurity implantation for Vt control using an n-type impurity is performed on the semiconductor substrate 1 in the PFET formation region 50P, although the process thereof is not shown. Subsequently, a heat treatment for activating the implanted impurities is performed and a surface oxide film on the semiconductor substrate 1 is removed. Thereafter, a thermal oxidation film (not shown) made of silicon dioxide and having a thickness of 1.5 nm is formed by a thermal oxidation method on the surface of the semiconductor substrate 1. Subsequently, a hafnium silicon oxide (HfSiO) film having a thickness of 3.0 nm is deposited by a CVD method on the thermal oxidation film. Then performing a nitridation process on the surface of the deposited HfSiO film, the gate insulating film 3 is formed which is a laminated film of hafnium silicon oxynitride (HfSiON) containing a high dielectric material and silicon dioxide ($SiO_2$). Note that the high dielectric material is not limited to hafnium silicon oxynitride, and there can be used hafnium silicon oxide (HfSiO), hafnium dioxide ($HfO_2$), an oxide of zirconium ($ZrO_2$), or the like. The gate insulating film 3 may also be made of silicon dioxide ($SiO_2$) or silicon oxynitride (SiON) which does not contain a high dielectric material. Subsequently, the titanium nitride (TiN) film 4 having a thickness of 10 nm is deposited over the entire surface of the gate insulating film 3. For the deposition of the TiN film 4, there can be used herein a chemical vapor deposition (CVD) method, a physical deposition (PVD) method, an atomic layer deposition (ALD) method, or the like. The metal material for the metal gate is not limited to TiN, and there can be used a material containing a metal having an effective work function of not less than 4.6 eV, and effective in improving the operation characteristics of the PFET, such as TaCNO or TaN. Subsequently, a resist mask (not shown) covering the PFET formation region 50P is formed by a lithographic process. Using the formed resist mask, the TiN film 4 in the NFET formation region 50N is removed by wet etching. Thereafter, the resist mask is removed.

Figure 4B:
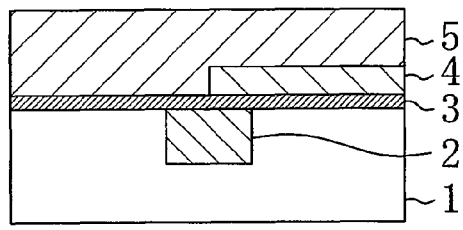

Next, as shown in FIG. 4B, the polysilicon film 5 having conductivity and a thickness of 100 nm is deposited by a CVD method over the entire upper surfaces of the gate insulating film 3 and the TiN film 4.

Figure 4C:
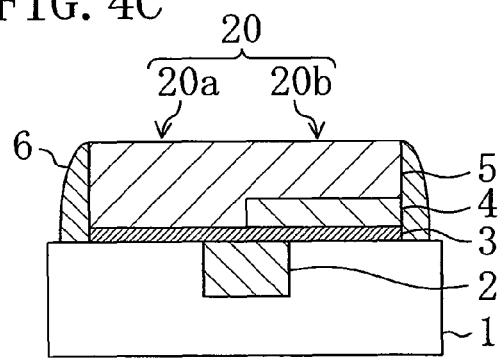

Next, as shown in FIG. 4C, gate patterning is performed by a lithographic process and a dry etching process, thereby forming the first gate electrode portion 20a including the polysilicon film 5 in the NFET formation region 50N, while forming the second gate electrode portion 20b including the TiN film 4 and the polysilicon film 5, and serving as the metal gate in the PFET formation region 50P. Subsequently, a lightly doped drain (LDD) implantation is performed on the semiconductor substrate 1 using the gate electrode 20 as a mask, sidewalls 6 are formed on the side surfaces of the gate electrode 20, source/drain implantation is performed on the semiconductor substrate 1 using the gate electrode 20 and the sidewalls 6 as a mask, and a heat treatment for activating the implanted impurity is performed, although the processes thereof are not shown.

Figure 4D:
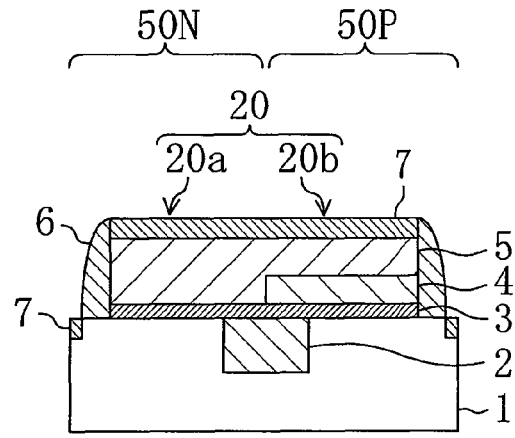

Next, as shown in FIG. 4D, a nickel (Ni) film is deposited over the entire upper surface of the semiconductor substrate 1, and a predetermined heat treatment is performed, thereby forming the nickel silicide layer 7 on each of the source/drain regions and the gate electrode 20.

Figure 4E:
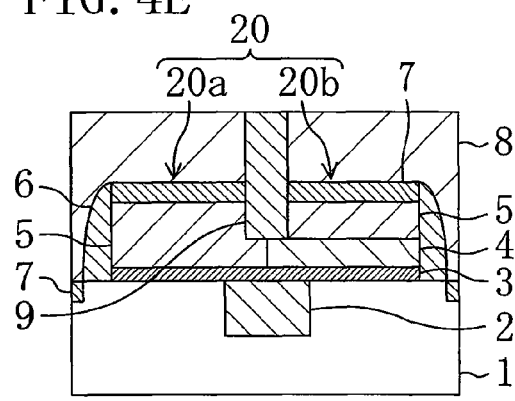

Next, as shown in FIG. 4E, the interlayer insulating film 8 is deposited over the semiconductor substrate 1, and the upper surface of the deposited interlayer insulating film 8 is planarized by a chemical mechanical polishing (CMP) method. Subsequently, a contact hole is selectively formed to expose the underlying TiN film 4 through the interlayer insulating film 8, the nickel silicide layer 7, and the polysilicon film 5 at the boundary portion between the NFET formation region 50N and the PFET formation region 50P in the gate electrode 20. Thereafter, a Ti film is deposited by a sputtering method, and successively, a TiN film and a W film are deposited by a CVD method to fill the contact hole, thereby forming the contact 9.

In this manner, in the PFET formation region 50P, the metal gate of the MIPS structure in which the contact 9 is directly connected to the TiN film 4 is formed, while a polysilicon gate is formed in the NFET formation region 50N.

By the fabrication method described above, the semiconductor device having the NFET and the PFET each appropriate for a high-frequency operation can be formed.

Embodiment 2

Referring to the drawings, a second example embodiment will be described.

Figure 5:
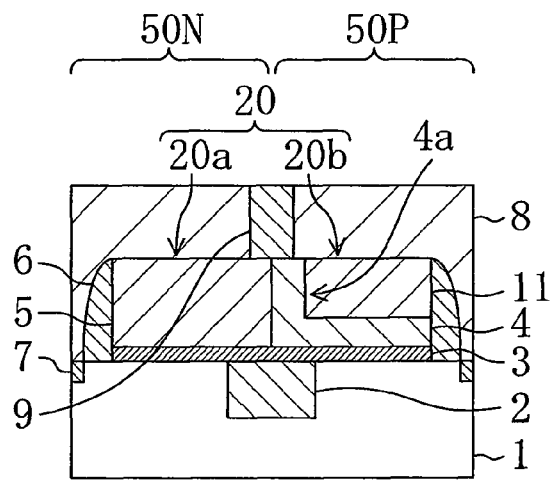
FIG. 5 is a structural cross-sectional view of a semiconductor device according to a second example embodiment.

FIG. 5 shows a cross-sectional structure in the gate width direction of a transistor including a metal gate having a MIPS structure as a semiconductor device according to the second example embodiment.

As shown in FIG. 5, an upper portion of the semiconductor substrate 1 made of Si is partitioned into the NFET formation region 50N and the PFET formation region 50P by the isolation film 2 made of STI or the like.

On the principal surface of the semiconductor substrate 1 having the isolation film 2 formed therein, there is formed the gate insulating film 3 including a $SiO_2$ film having a thickness of 1.5 nm and a HfSiON film having a thickness of 3.0 nm.

On the gate insulating film 3, there is formed the gate electrode 20 extending continuously between the NFET formation region 50N and the PFET formation region 50P. Specifically, in the NFET formation region 50N, the first gate electrode portion 20a is formed which includes the first polysilicon film 5 having a thickness of 100 nm. In the PFET formation region 50P, the second gate electrode portion 20b is formed which includes the TiN film 4 having a thickness of 10 nm and a second polysilicon film 11 having a thickness of 90 nm.

A characteristic feature of the second example embodiment is that the TiN film 4 forming the PFET has a vertical portion 4a protruding upwardly and vertically to the principal surface of the semiconductor substrate 1 in the portion of the PFET formation region 50P which is closer to the NFET formation region 50N. The position where the vertical portion 4a is formed is not necessarily limited to a boundary portion between the NFET formation region 50N and the PFET formation region 50P.

The gate electrode 20 is covered with the interlayer insulating film 8 made of, e.g., silicon dioxide. In the portion of the gate electrode 20 located above the vertical portion 4a of the TiN film 4, the contact 9 is formed by laminating Ti, TiN, and W to extend through the interlayer insulating film 8 and be directly connected to the vertical portion 4a of the TiN film 4.

Thus, according to the second example embodiment, the contact 9 is directly connected to the vertical portion 4a of the TiN film 4 forming the second gate electrode portion 20b which is exposed from the second polysilicon film 11. Consequently, the electronic charge can run easily through the contact 9 to the TiN film 4 without passing through the interface between the polysilicon film 5 and the TiN film 4 which tends to have a high resistance. This allows the PFET to operate at a high speed.

Variation 1 of Embodiment 2

Figure 6:
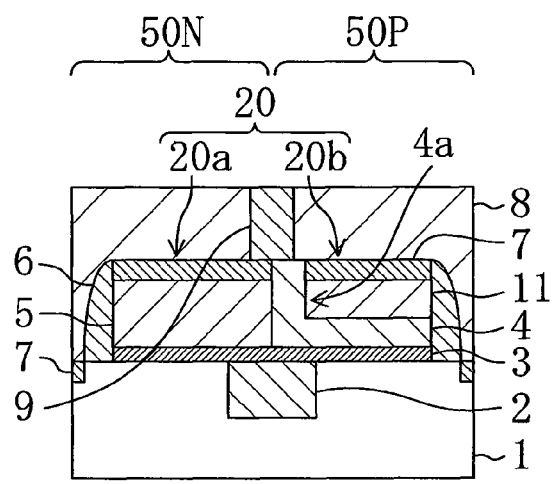
FIG. 6 is a structural cross-sectional view of a semiconductor device according to a first variation of the second example embodiment.

FIG. 6 shows a cross-sectional structure of a semiconductor device according to a first variation of the second example embodiment. A description of the components shown in FIG. 6 which are the same as those shown in FIG. 5 will be omitted by providing the same reference characters.

As shown in the first variation of FIG. 6, the nickel silicide layer 7 may also be formed on each of the first polysilicon film 5 and the second polysilicon film 11 which form the gate electrode 20.

Variation 2 of Embodiment 2

Figure 7:
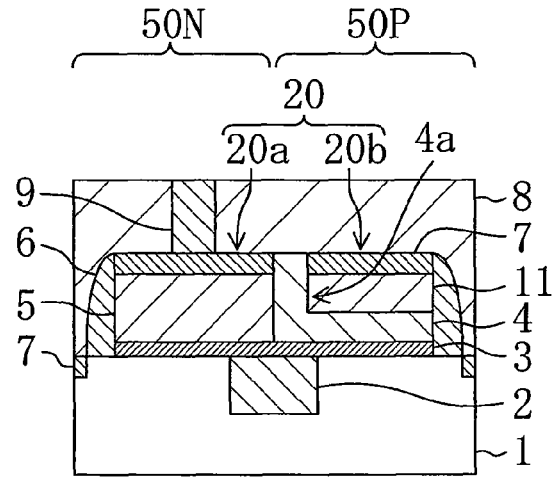
FIG. 7 is a structural cross-sectional view of a semiconductor device according to a second variation of the second example embodiment.

As in a second variation shown in FIG. 7, in the case where the nickel silicide layer 7 is formed on each of the polysilicon films 5 and 11 forming the gate electrode 20, the contact 9 need not necessarily be directly connected to the vertical portion 4a of the TiN film 4 and may also be connected thereto via the nickel silicide layer 7.

A method for fabricating the semiconductor device thus structured will be described below with reference to the drawings.

FIGS. 8A-8F show cross-sectional structures of the semiconductor device according to the first variation of the second example embodiment in the order of process steps of the fabrication method therefor.

Figure 8A:
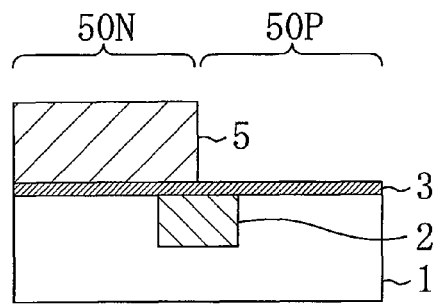
FIGS. 8A-8F are structural cross-sectional views for illustrating a method for fabricating the semiconductor device according to the first variation of the second example embodiment in the order of process steps.

First, as shown in FIG. 8A, the isolation film 2 made of STI or the like is selectively formed in the upper portion of the semiconductor substrate 1 made of Si to partition the semiconductor substrate 1 into the NFET formation region 50N and the PFET formation region 50P. Then, impurity implantation for Vt control using a p-type impurity is performed on the semiconductor substrate 1 in the NFET formation region 50N, while impurity implantation for Vt control using an n-type impurity is performed on the semiconductor substrate 1 in the PFET formation region 50P, although the process thereof is not shown. Subsequently, a heat treatment for activating the implanted impurities is performed and a surface oxide film on the semiconductor substrate 1 is removed. Thereafter, a thermal oxidation film (not shown) made of silicon dioxide and having a thickness of 1.5 nm is formed by a thermal oxidation method on the surface of the semiconductor substrate 1. Subsequently, a HfSiO film having a thickness of 3.0 nm is deposited by a CVD method on the thermal oxidation film. Then performing a nitridation process on the surface of the deposited HfSiO film, the gate insulating film 3 is formed which is a laminated film of hafnium silicon oxynitride (HfSiON) containing a high dielectric material and silicon dioxide ($SiO_2$). Note that the gate insulating film 3 may also be made of $SiO_2$ or SiON which does not contain a high dielectric material. Subsequently, over the entire upper surface of the gate insulating film 3, the first polysilicon film 5 having conductivity and a thickness of 150 nm is deposited by a CVD method. Subsequently, a resist mask (not shown) covering the NFET formation region 50N is formed by a lithographic process and, using the formed resist mask, the first polysilicon film 5 in the PFET formation region 50P is removed by wet etching. Here, for the wet etching performed on polysilicon, an ammonia ($NH_3$) solution can be used. The etching selectivity of HfSiON to silicon when the ammonia solution is used is substantially zero. Therefore, it is possible to etch the first polysilicon film 5 using the ammonia solution without etching the gate insulating film 3. Thereafter, the resist mask is removed.

Figure 8D:
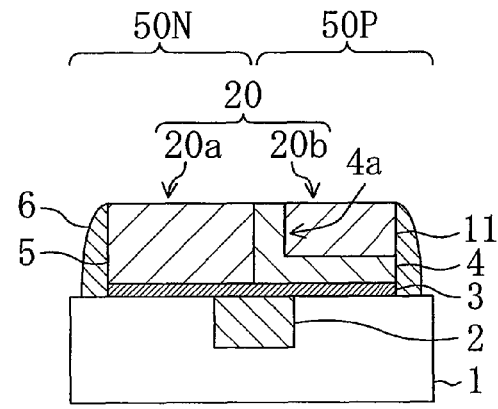
Figure 8B:
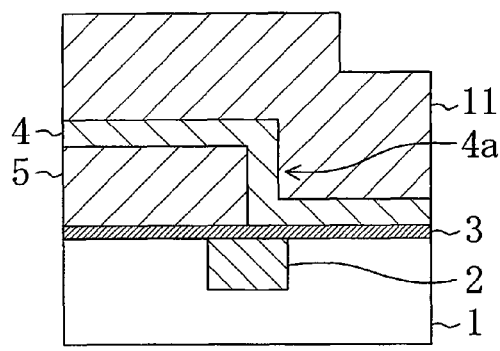

Next, as shown in FIG. 8B, the TiN film 4 having a thickness of 10 nm is deposited by a PVD method over the entire upper surfaces of the gate insulating film 3 and the first polysilicon film 5. For the deposition of the TiN film 4, a CVD method or an ALD method may also be used. Note that, in the deposited TiN film 4, the vertical portion 4a needs to be formed on the end surface of the first polysilicon film 5 formed in the NFET formation region 50N which is closer to the PFET formation region 50P. A metal material for forming the metal gate of the PFET is not limited to TiN, and there can be used a metal material having an effective work function of not less than 4.6 eV, and effective in improving the operation characteristics of the PFET, such as TaCNO or TaN. Subsequently, by a CVD method, the second polysilicon film 11 having conductivity and a thickness of 150 nm is deposited on the TiN film 4.

Figure 8E:
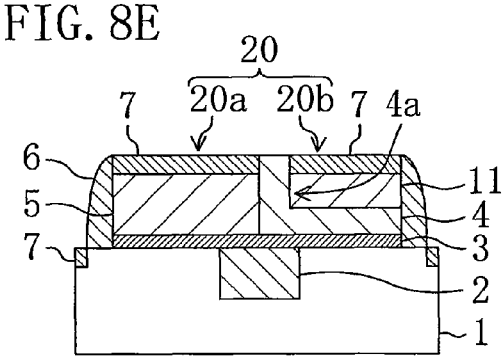
Figure 8C:
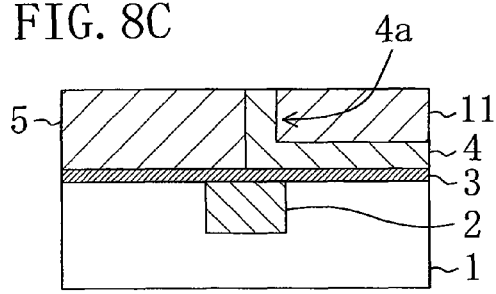

Next, as shown in FIG. 8C, polishing is performed by a CMP method on the deposited second polysilicon film 11, the TiN film 4, and the first polysilicon film 5 to planarize the surfaces thereof. The polishing is performed herein to adjust the thickness of the first polysilicon film 5 in the NFET formation region 50N to 100 nm so that the thickness of the second polysilicon film 11 in the PFET formation region 50P becomes 90 nm. By the CMP step, in the boundary portion between the NFET formation region 50N and the PFET formation region 50P, the vertical portion 4a of the deposited TiN film 4 is exposed from between the first polysilicon film 5 and the second polysilicon film 11.

Next, as shown in FIG. 8D, gate patterning is performed by a lithographic process and a dry etching process, thereby forming the first gate electrode portion 20a including the first polysilicon film 5 in the NFET formation region 50N, while forming the second gate electrode portion 20b including the TiN film 4 and the second polysilicon film 11, and serving as the metal gate in the PFET formation region 50P. Subsequently, an LDD layer is formed by performing extension implantation on the semiconductor substrate 1 using the gate electrode 20 as a mask, the sidewalls 6 are formed on the side surfaces of the gate electrode 20, source/drain implantation is performed on the semiconductor substrate 1 using the gate electrode 20 and the sidewalls 6 as a mask, and a heat treatment for activating the implanted impurity is performed, although the processes thereof are not shown.

Next, as shown in FIG. 8E, a nickel (Ni) film is deposited over the entire upper surface of the semiconductor substrate 1, and a predetermined heat treatment is performed, thereby forming the nickel silicide layer 7 on each of source/drain regions and the first polysilicon film 5 and the second polysilicon film 11 which form the gate electrode 20.

Figure 8F:
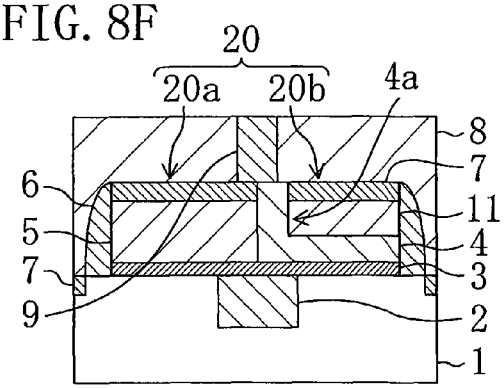

Next, as shown in FIG. 8F, the interlayer insulating film 8 is deposited over the semiconductor substrate 1, and the upper surface of the deposited interlayer insulating film 8 is planarized by a CMP method. Subsequently, in the interlayer insulating film 8 in the boundary portion between the NFET formation region 50N and the PFET formation region 50P in the gate electrode 20, a contact hole is formed to expose the vertical portion 4a of the underlying TiN film 4. Thereafter, a Ti film is deposited by a sputtering method, and successively, a TiN film and a W film are deposited by a CVD method to fill the contact hole, thereby forming the contact 9.

In this manner, in the PFET formation region 50P, the metal gate of the MIPS structure is formed in which the contact 9 is directly connected to the vertical portion 4a of the TiN film 4, while a polysilicon gate is formed in the NFET formation region 50N.

As described above, in the second example embodiment, the TiN film 4 forming the metal gate of the PFET is provided with the vertical portion 4a exposed from the second polysilicon film 11 formed on the TiN film 4. Therefore, by merely forming the contact hole only in the interlayer insulating film 8, there can be formed the semiconductor device having the NFET and the PFET each appropriate for a high-frequency operation.

Note that, in the case of forming the nickel silicide layer 7 on each of the polysilicon films 5 and 11 forming the gate electrode 20 as in the fabrication method described above, the lower end portion of the contact 9 need not necessarily be directly connected to the vertical portion 4a of the TiN film 4 as long as the lower portion of the contact 9 is directly connected to the nickel silicide layer 7.

Embodiment 3

Referring to the drawings, a third example embodiment will be described.

Figure 9:
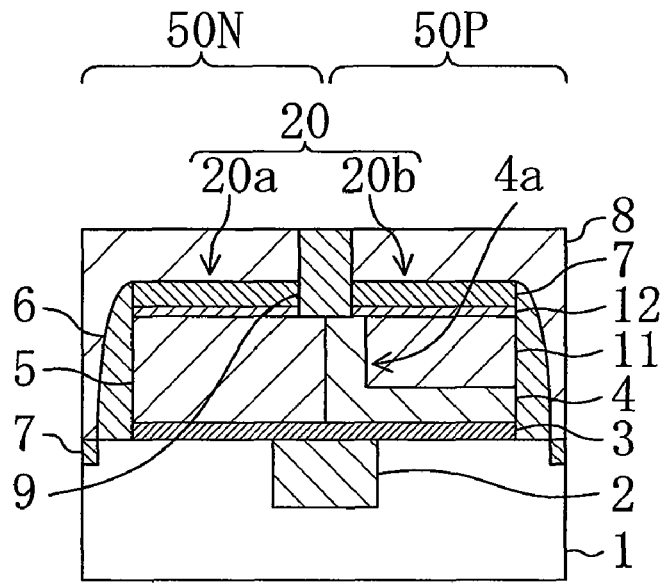
FIG. 9 is a structural cross-sectional view showing a semiconductor device according to a third example embodiment.

FIG. 9 shows a cross-sectional structure in the gate width direction of a transistor including a metal gate having a MIPS structure as a semiconductor device according to the third example embodiment. A description of the components shown in FIG. 9 which are the same as those shown in FIG. 6 will be omitted by providing the same reference characters.

As shown in FIG. 9, in the semiconductor device according to the third example embodiment, on each of the first polysilicon film 5, the vertical portion 4a of the TiN film 4, and the second polysilicon film 11 which form the gate electrode 20, there is formed a third polysilicon film 12 having conductivity and a thickness of 20 nm.

Note that, on the third polysilicon film 12, there is formed the nickel silicide layer 7. Consequently, the contact 9 extends through the nickel silicide layer 7 and the third polysilicon film 12 and is directly connected to the upper end surface of the vertical portion 4a of the TiN film 4.

Variation 1 of Embodiment 3

Figure 10:
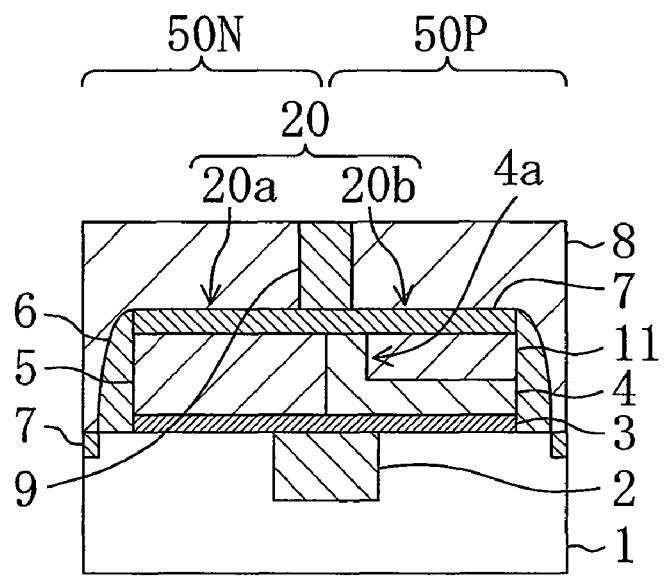
FIG. 10 is a structural cross-sectional view of a semiconductor device according to a variation of the third example embodiment.

FIG. 10 shows a cross-sectional structure of a semiconductor device according to a variation of the third example embodiment.

As shown in FIG. 10, in the semiconductor device according to the present variation, the thickness of the third polysilicon film 12 is reduced to, e.g., about 10 nm. As a result, the nickel silicide layer 7 is in direct contact with the first polysilicon film 5, the vertical portion 4a of the TiN film 4, and the second polysilicon film 11.

In this case, the lower end surface of the contact 9 need not be directly connected to the upper end surface of the vertical portion 4a of the TiN film 4 as long as the lower end surface of the contact 9 is connected to the nickel silicide layer 7. Accordingly, as shown in the second variation of the second example embodiment shown in FIG. 7, the position where the contact 9 is formed may be shifted from a portion located above the vertical portion 4a of the TiN film 4.

A method for fabricating the semiconductor device having a structure as described above will be described below with reference to the drawings.

Figure 11A:
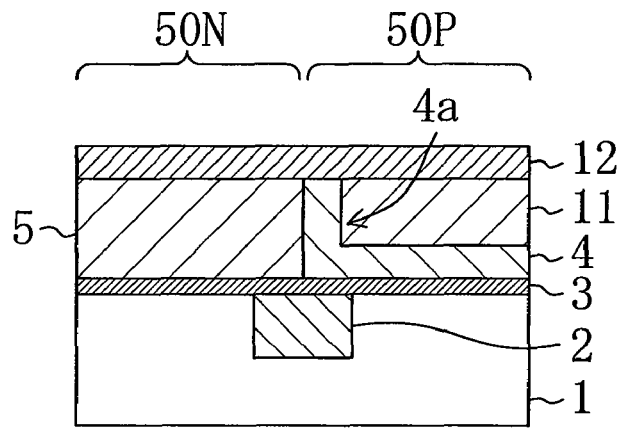
FIGS. 11A-11C are structural cross-sectional views for illustrating a method for fabricating the principal portion of the semiconductor device according to the third example embodiment in the order of process steps.
Figure 11B:
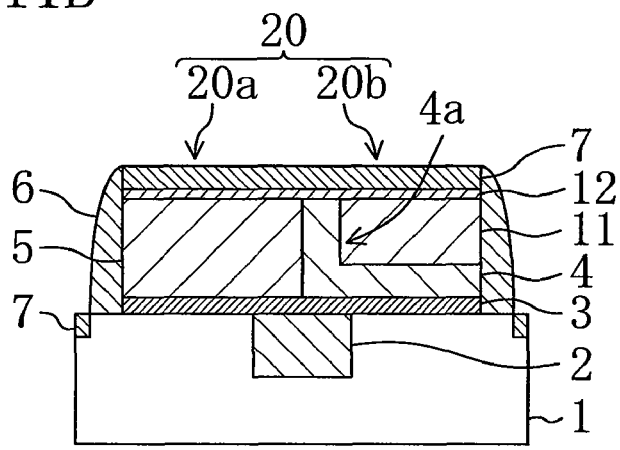
Figure 11C:
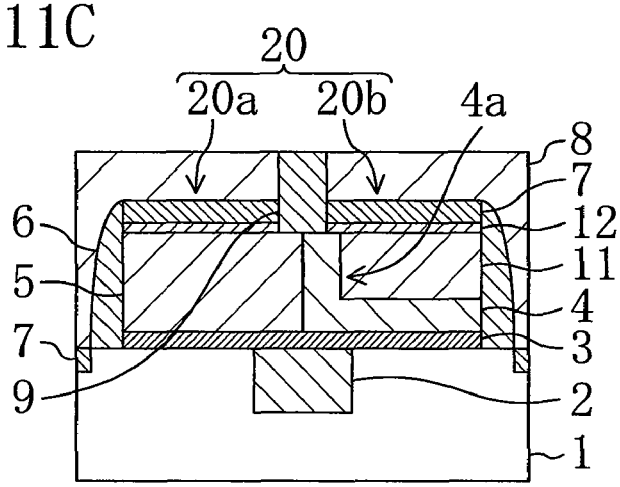

FIGS. 11A-11C show cross-sectional structures of the principal portion of the semiconductor device according to the third example embodiment in the order of process steps of the fabrication method therefor. Here, only the differences with the second example embodiment will be described.

First, as shown in FIG. 11A, over the entire upper surface of the first polysilicon film 5 in the NFET formation region 50N and over the entire upper surfaces of the second polysilicon film 11 and the vertical portion 4a of the TiN film 4 in the PFET formation region 50P, which have been planarized by a CMP method, the third polysilicon film 12 having conductivity and a thickness of 20 nm is deposited by a CVD method. By depositing the third polysilicon film 12, the upper end surface of the vertical portion 4a of the TiN film 4 exposed from the first polysilicon film 5 and the second polysilicon film 11 is covered. This allows the prevention of metal contamination during extension implantation or the like.

Next, as shown in FIG. 11B, gate patterning is performed by a lithographic process and a dry etching process, thereby forming the first gate electrode portion 20a including the first polysilicon film 5 and the third polysilicon film 12 in the NFET formation region 50N, while forming the second gate electrode portion 20b including the TiN film 4, the second polysilicon film 11, and the third polysilicon film 12, and serving as the metal gate in the PFET formation region 50P. Subsequently, a lightly doped drain (LDD) implantation is performed on the semiconductor substrate 1 using the gate electrode 20 as a mask, sidewalls 6 are formed on the side surfaces of the gate electrode 20, source/drain implantation is performed on the semiconductor substrate 1 using the gate electrode 20 and the sidewalls 6 as a mask, and a heat treatment for activating the implanted impurity is performed, although the processes thereof are not shown. Thereafter, a nickel (Ni) film is deposited over the entire upper surface of the semiconductor substrate 1, and a predetermined heat treatment is performed, thereby forming the nickel silicide layer 7 on each of source/drain regions and the third polysilicon film 12. When the thickness of the third polysilicon film 12 is about 10 nm, a portion of the third polysilicon film 12 accounting for a major part of the thickness thereof is changed into the nickel silicide layer 7.

Next, as shown in FIG. 11C, the interlayer insulating film 8 is deposited over the semiconductor substrate 1, and the upper surface of the deposited interlayer insulating film 8 is planarized by a CMP method. Subsequently, in a boundary portion between the NFET formation region 50N and the PFET formation region 50P in the gate electrode 20, a contact hole is formed to extend through the interlayer insulating film 8, the nickel silicide layer 7, and the third polysilicon film 12 and expose the vertical portion 4a of the TiN film 4. Thereafter, a Ti film is deposited by a sputtering method, and successively, a TiN film and a W film are deposited by a CVD method to fill the contact hole, thereby forming the contact 9. In the case where the thickness of the third polysilicon film 12 is reduced or the thickness of the nickel film is increased, the third polysilicon film 12 is entirely silicidized, and the nickel silicide layer 7 is directly connected to the vertical portion 4a of the TiN film 4. Therefore, it is sufficient only to open the contact hole over the nickel silicide layer 7.

In this manner, in the PFET formation region 50P, the metal gate of the MIPS structure is formed in which the contact 9 is connected directly to the vertical portion 4a of the TiN film 4 or via the nickel silicide layer 7, while a polysilicon gate is formed in the NFET formation region 50N.

As described above, in the third example embodiment, the TiN film 4 forming the metal gate of the PFET is provided with the vertical portion 4a exposed from the second polysilicon film 11 formed on the TiN film 4, and the contact 9 is provided which extends through the nickel silicide layer 7 and the third polysilicon film 12 covering the vertical portion 4a to the vertical portion 4a. As a result, no polysilicon film is present in a current path between the contact 9 and the TiN film 4. Therefore, it is possible to form the semiconductor device having the NFET and the PFET each appropriate for a high-frequency operation.

Embodiment 4

Referring to the drawings, a fourth example embodiment will be described.

Figure 12:
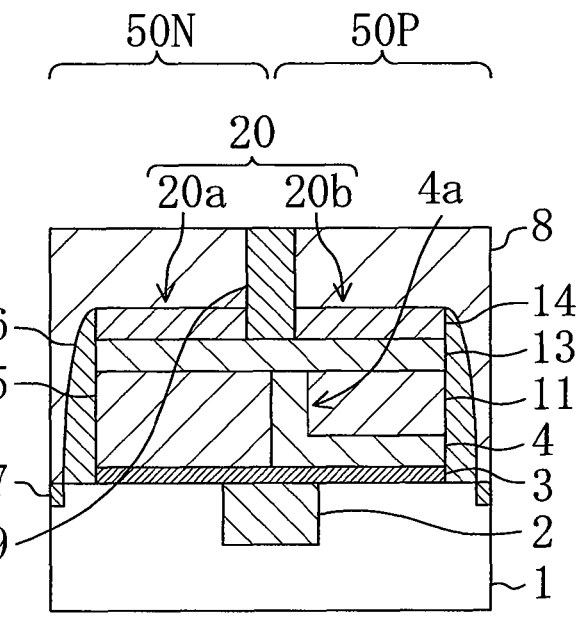
FIG. 12 is a structural cross-sectional view showing a semiconductor device according to a fourth example embodiment.

FIG. 12 shows a cross-sectional structure in the gate width direction of a transistor including a metal gate having a MIPS structure as a semiconductor device according to the fourth example embodiment. A description of the components shown in FIG. 12 which are the same as those shown in FIG. 5 will be omitted by providing the same reference characters.

As shown in FIG. 12, in the semiconductor device according to the fourth example embodiment, a metal film 13 including a TiN film having a thickness of 10 nm and a W film having a thickness of 50 nm, and a cap insulating film 14 made of silicon nitride (SiN) are successively formed on the first polysilicon film 5, the vertical portion 4a of the TiN film 4, and the second polysilicon film 11 which form the gate electrode 20.

Therefore, the contact 9 according to the fourth example embodiment extends through the cap insulating film 14 and is electrically connected to the upper end surface of the vertical portion 4a of the TiN film 4 via the metal film 13.

Variation of Embodiment 4

Figure 13:
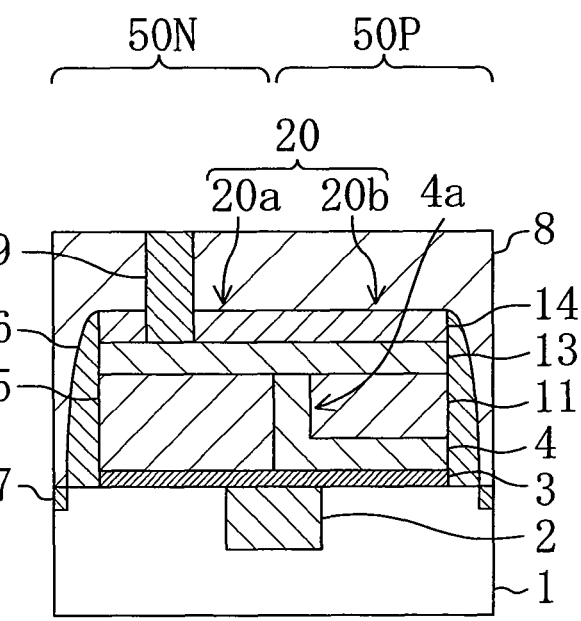
FIG. 13 is a structural cross-sectional view of a semiconductor device according to a variation of the fourth example embodiment.

FIG. 13 shows a variation of the fourth example embodiment. In the fourth example embodiment, the TiN film 4 of the metal gate forming the PFET is electrically connected to the contact 9 via the metal film 13. Accordingly, as shown in FIG. 13, the position where the contact 9 is formed may be shifted from a portion located above the vertical portion 4a of the TiN film 4.

A method for fabricating the semiconductor device having a structure as described above will be described below with reference to the drawings.

Figure 14A:
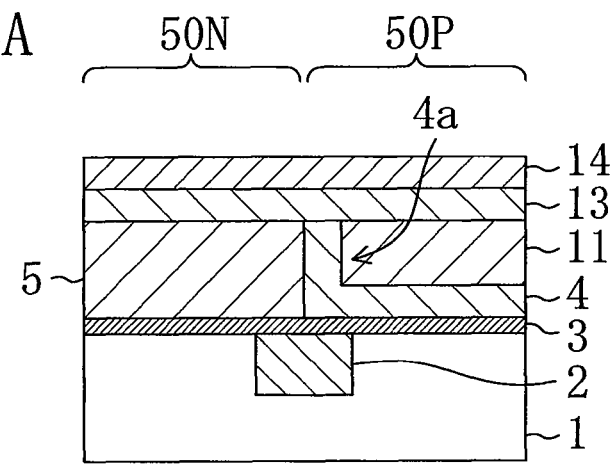
FIGS. 14A-14C are structural cross-sectional views for illustrating a method for fabricating the principal portion of the semiconductor device according to the fourth example embodiment in the order of process steps.
Figure 14B:
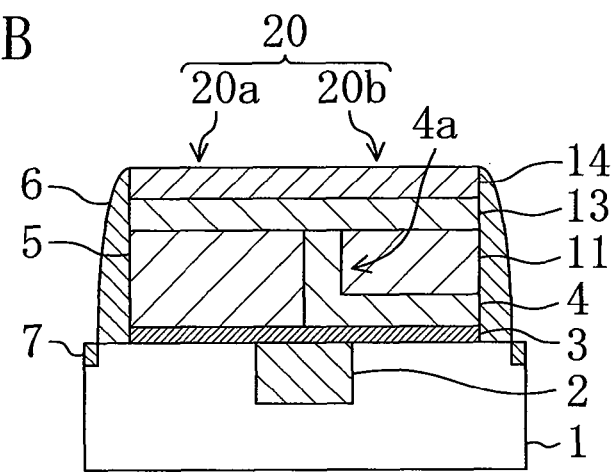
Figure 14C:
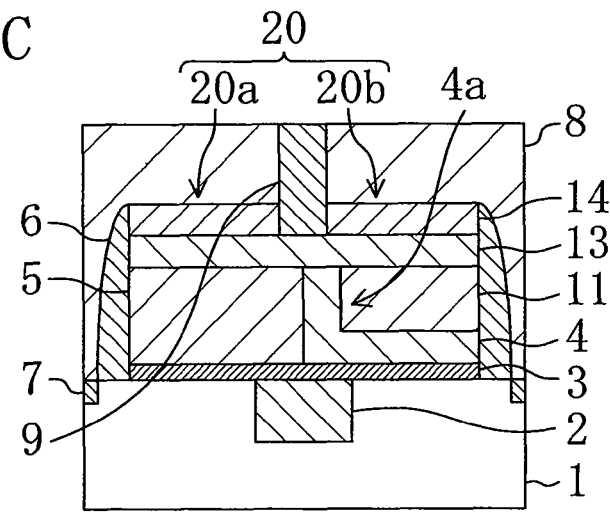

FIGS. 14A-14C show cross-sectional structures of the principal portion of the semiconductor device according to the fourth example embodiment in the order of process steps of the fabrication method therefor. Here, only the differences with the second example embodiment and the third example embodiment will be described.

First, as shown in FIG. 14A, over the entire upper surface of the first polysilicon film 5 in the NFET formation region 50N and over the entire upper surfaces of the second polysilicon film 11 and the vertical portion 4a of the TiN film 4 in the PFET formation region 50P, which have been planarized by a CMP method, the metal film 13 is formed by depositing the TiN film having a thickness of 10 nm by a PVD method, and depositing the W film having a thickness of 50 nm by a PVD method. Subsequently, on the metal film 13, the cap insulating film 14 is formed by depositing SiN having a thickness of 100 nm by a low-pressure CVD method.

Next, as shown in FIG. 14B, gate patterning is performed by a lithographic process and a dry etching process, thereby forming the first gate electrode portion 20a including the first polysilicon film 5, the metal film 13, and the cap insulating film 14 in the NFET formation region 50N, while forming the second gate electrode portion 20b including the TiN film 4, the second polysilicon film 11, the metal film 13, and the cap insulating film 14 and serving as the metal gate in the PFET formation region 50P. Subsequently, a lightly doped drain (LDD) implantation is performed on the semiconductor substrate 1 using the gate electrode 20 as a mask, the sidewalls 6 are formed on the side surfaces of the gate electrode 20, source/drain implantation is performed on the semiconductor substrate 1 using the gate electrode 20 and the sidewalls 6 as a mask, and a heat treatment for activating the implanted impurity is performed, although the processes thereof are not shown. Thereafter, a nickel (Ni) film is deposited over the entire upper surface of the semiconductor substrate 1, and a predetermined heat treatment is performed, thereby forming the nickel silicide layer 7 on each of source/drain regions.

Next, as shown in FIG. 14C, the interlayer insulating film 8 is deposited over the semiconductor substrate 1, and the upper surface of the deposited interlayer insulating film 8 is planarized by a CMP method. Subsequently, in a boundary portion between the NFET formation region 50N and the PFET formation region 50P in the gate electrode 20, a contact hole is formed to extend through in the interlayer insulating film 8 and the cap insulating film 14 and expose the metal film 13. Thereafter, a Ti film is deposited by a sputtering method, and successively, a TiN film and a W film are deposited by a CVD method to fill the contact hole, thereby forming the contact 9.

In this manner, in the PFET formation region 50P, the metal gate of the MIPS structure is formed in which the contact 9 is connected to the vertical portion 4a of the TiN film 4 via the metal film 13 formed by laminating the TiN film and the W film, while a polysilicon gate is formed in the NFET formation region 50N.

As described above, in the fourth example embodiment, the TiN film 4 forming the metal gate of the PFET is provided with the vertical portion 4a exposed from the second polysilicon film 11 formed on the TiN film 4, and the metal film 13 covering the vertical portion 4a is provided. As a result, no polysilicon film is present in the current path between the contact 9 and the TiN film 4. Therefore, it is possible to form the semiconductor device having the NFET and the PFET each appropriate for a high-frequency operation.

Embodiment 5

Referring to the drawings, a fifth example embodiment will be described.

Figure 15:
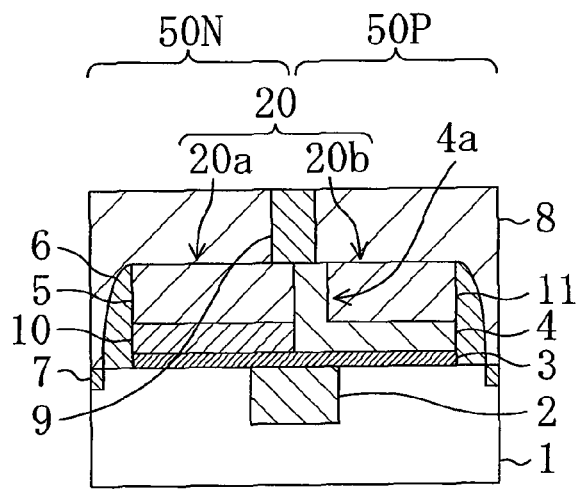
FIG. 15 is a structural cross-sectional view showing a semiconductor device according to a fifth example embodiment.

FIG. 15 shows a cross-sectional structure in the gate width direction of a transistor including a metal gate having a MIPS structure as a semiconductor device according to the fifth example embodiment. A description of the components shown in FIG. 15 which are the same as those shown in FIG. 5 will be omitted by providing the same reference characters.

As shown in FIG. 15, in the semiconductor device according to the fifth example embodiment, even in the first gate electrode portion 20a forming the NFET, tantalum carbide ($Ta_2C$), e.g., which is a metal material effective in improving the operation characteristics of the NFET is provided between the gate insulating film 3 and the first polysilicon film 5 to provide the metal gate having the MIPS structure.

In addition, the contact 9 according to the fifth example embodiment is directly connected to the upper surface of the vertical portion 4a of the TiN film 4.

Variation 1 of Embodiment 5

Figure 16:
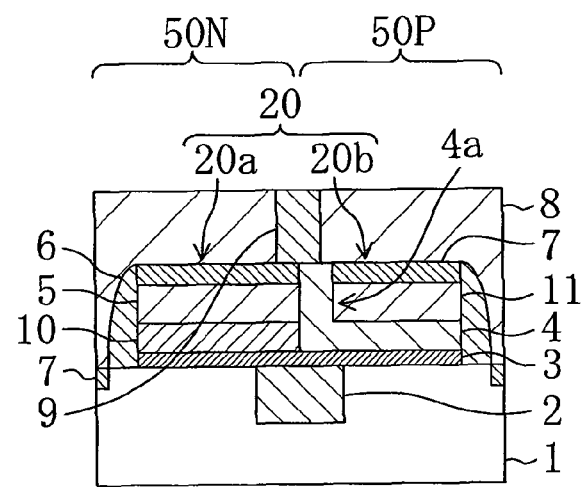
FIG. 16 is a structural cross-sectional view of a semiconductor device according to a first variation of the fifth example embodiment.

FIG. 16 shows a cross-sectional structure of a semiconductor device according to a first variation of the fifth example embodiment. A description of the components shown in FIG. 16 which are the same as those shown in FIG. 15 will be omitted by providing the same reference characters.

As shown in the first variation of FIG. 16, the nickel silicide layer 7 may also be formed on each of the first polysilicon film 5 and the second polysilicon film 11 which form the gate electrode 20.

Variation 2 of Embodiment 5

Figure 17:
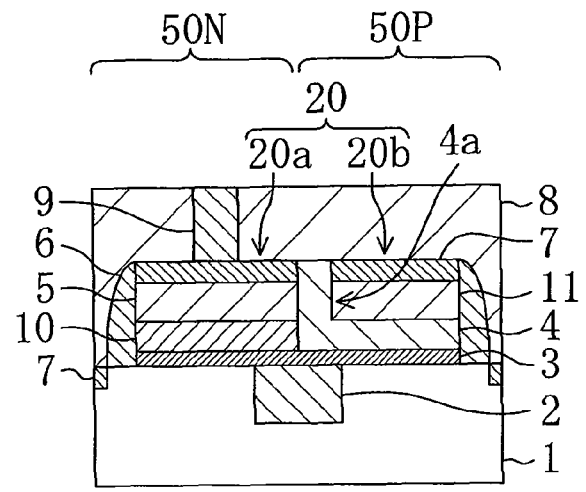
FIG. 17 is a structural cross-sectional view of a semiconductor device according to a second variation of the fifth example embodiment.

As in a second variation shown in FIG. 17, in the case where the nickel silicide layer 7 is formed on each of the polysilicon films 5 and 11 forming the gate electrode 20, the contact 9 need not necessarily be directly connected to the vertical portion of the TiN film 4, and may also be connected thereto via the nickel silicide layer 7.

A method for fabricating the semiconductor device thus structured will be described below with reference to the drawings.

FIGS. 18A-18F show cross-sectional structures of the semiconductor device according to the first variation of the fifth example embodiment in the order of process steps of the fabrication method therefor.

Figure 18A:
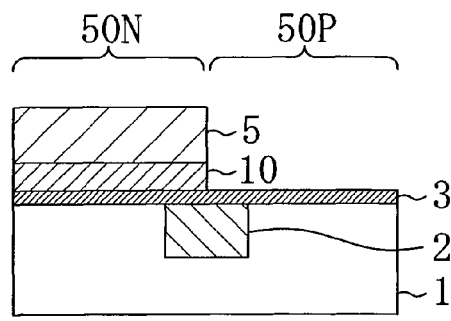
FIGS. 18A-18F are structural cross-sectional views for illustrating a method for fabricating the semiconductor device according to the first variation of the fifth example embodiment in the order of process steps.

First, as shown in FIG. 18A, the isolation film 2 made of STI or the like is selectively formed in the upper portion of the semiconductor substrate 1 made of Si to partition the semiconductor substrate 1 into the NFET formation region 50N and the PFET formation region 50P. Then, impurity implantation for Vt control using a p-type impurity is performed on the semiconductor substrate 1 in the first NFET formation region 50N, while impurity implantation for Vt control using an n-type impurity is performed on the semiconductor substrate 1 in the PFET formation region 50P, although the process thereof is not shown. Subsequently, a heat treatment for activating the implanted impurities is performed and a surface oxide film on the semiconductor substrate 1 is removed.

Thereafter, a thermal oxidation film (not shown) made of silicon dioxide and having a thickness of 1.5 nm is formed by a thermal oxidation method on the surface of the semiconductor substrate 1. Subsequently, a HfSiO film having a thickness of 3.0 nm is deposited by a CVD method on the thermal oxidation film. Then performing a nitridation process on the surface of the deposited HfSiO film, the gate insulating film 3 is formed which is a laminated film of hafnium silicon oxynitride (HfSiON) containing a high dielectric material and silicon dioxide ($SiO_2$). Note that the gate insulating film 3 may also be made of $SiO_2$ or SiON which does not contain a high dielectric material. Subsequently, over the entire upper surface of the gate insulating film 3, a $Ta_2C$ film 10 which is a metal material for the NFET and has a thickness of 10 nm is deposited by a PVD method. Subsequently, on the $Ta_2C$ film 10, the first polysilicon film 5 having conductivity and a thickness of 150 nm is deposited by a CVD method. Then, a resist mask (not shown) covering the NFET formation region 50N is formed by a lithographic process and, using the formed resist mask, the first polysilicon film 5 and the $Ta_2C$ film in the PFET formation region 50P are removed by wet etching. Thereafter, the resist mask is removed.

Figure 18D:
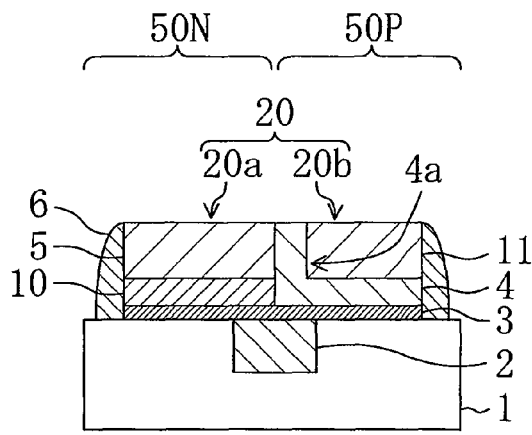
Figure 18B:
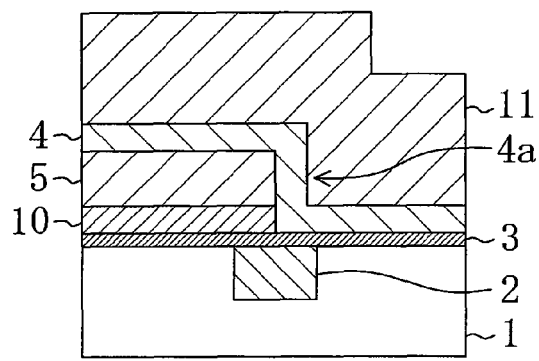

Next, as shown in FIG. 18B, the TiN film 4 which is a metal material for the PFET and has a thickness of 10 nm is deposited by a PVD method over the entire surfaces of the gate insulating film 3 and the first polysilicon film 5. For the deposition of the TiN film 4, a CVD method or an ALD method may also be used. Note that, in the deposited TiN film 4, the vertical portion 4a needs to be formed on the end surfaces of the $Ta_2C$ film 10 and the first polysilicon film 5 formed in the NFET formation region 50N which are closer to the PFET formation region 50P. A metal material for forming the metal gate of the PFET is not limited to TiN, and there can be used a metal material having an effective work function of not less than 4.6 eV, and effective in improving the operation characteristics of the PFET, such as TaCNO or TaN. Subsequently, by a CVD method, the second polysilicon film 11 having conductivity and a thickness of 150 nm is deposited on the TiN film 4.

Figure 18E:
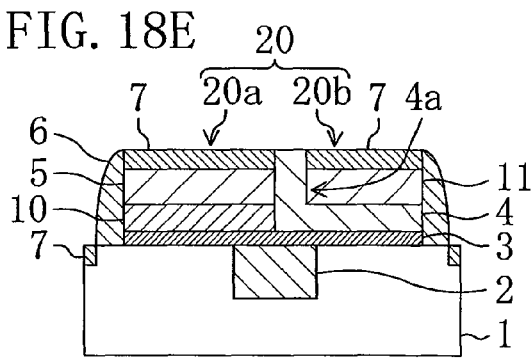
Figure 18C:
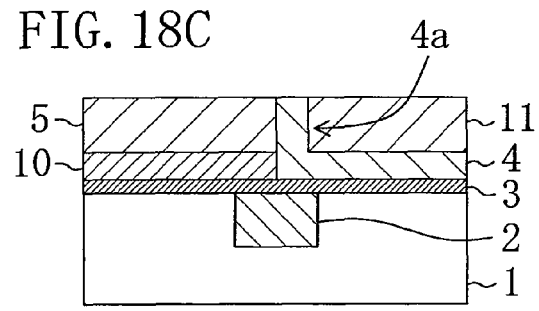

Next, as shown in FIG. 18C, polishing is performed by a CMP method on the deposited second polysilicon film 11, the TiN film 4, and the first polysilicon film 5 to planarize the surfaces thereof. The polishing is performed herein to adjust the thickness of the first polysilicon film 5 in the NFET formation region 50N to 90 nm so that the thickness of the second polysilicon film 11 in the PFET formation region 50P becomes 90 nm. By the CMP step, in a boundary portion between the NFET formation region 50N and the PFET formation region 50P, the vertical portion 4a of the deposited TiN film 4 is exposed from between the first polysilicon film 5 and the second polysilicon film 11.

Next, as shown in FIG. 18D, gate patterning is performed by a lithographic process and a dry etching process, thereby forming the first gate electrode portion 20a including the $Ta_2C$ film 10 and the first polysilicon film 5, and serving as the metal gate in the NFET formation region 50N, while forming the second gate electrode portion 20b including the TiN film 4 and the second polysilicon film 11, and serving as the metal gate in the PFET formation region 50P. Subsequently, a lightly doped drain (LDD) implantation is performed on the semiconductor substrate 1 using the gate electrode 20 as a mask, the sidewalls 6 are formed on the side surfaces of the gate electrode 20, source/drain implantation is performed on the semiconductor substrate 1 using the gate electrode 20 and the sidewalls 6 as a mask, and a heat treatment for activating the implanted impurity is performed, although the processes thereof are not shown.

Next, as shown in FIG. 18E, a nickel (Ni) film is deposited over the entire upper surface of the semiconductor substrate 1 and a predetermined heat treatment is performed, thereby forming the nickel silicide layer 7 on each of source/drain regions and the first polysilicon film 5 and the second polysilicon film 11 which form the gate electrode 20.

Figure 18F:
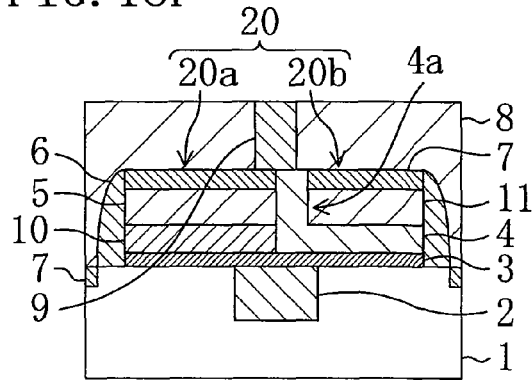
Figure 19A:
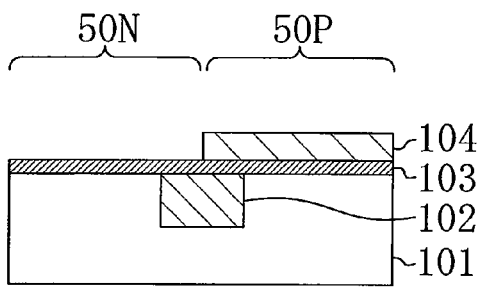
FIGS. 19A-19F are structural cross-sectional views for illustrating a method for fabricating a semiconductor device having a conventional metal gate of a MIPS structure in the order of process steps.
Figure 19D:
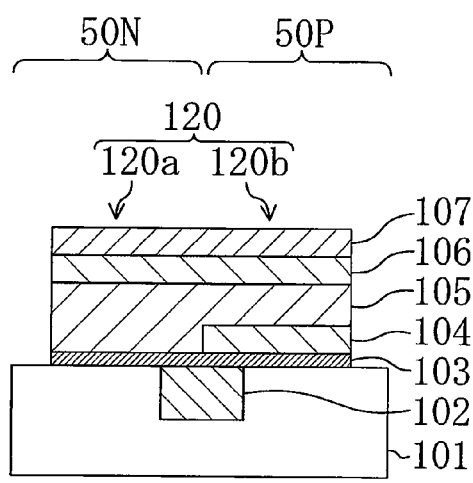
Figure 19B:
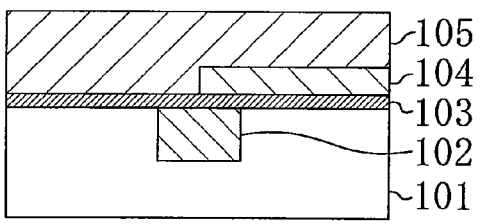
Figure 19E:
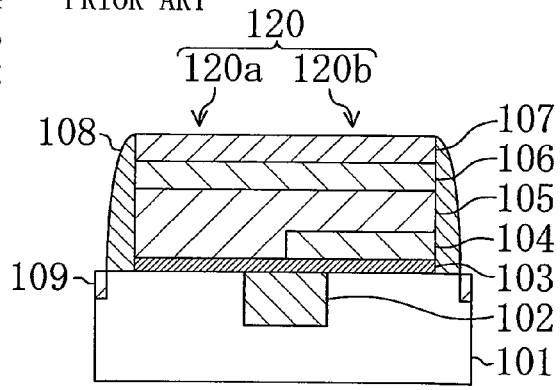
Figure 19C:
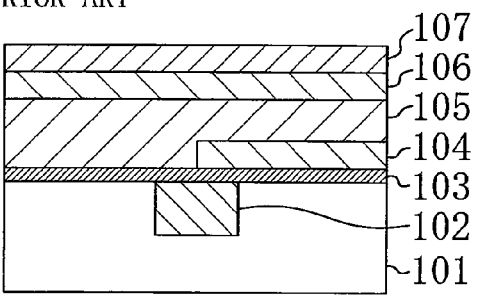
Figure 19F:
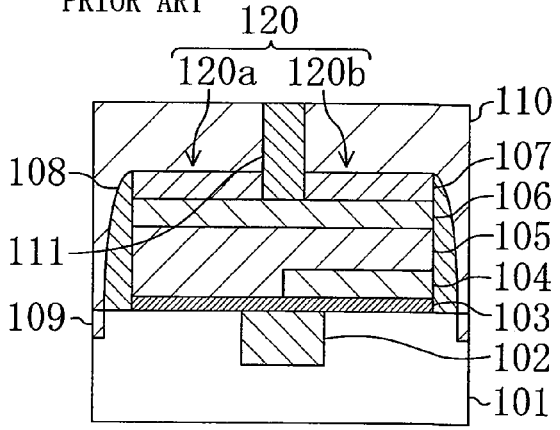
Figure 20:
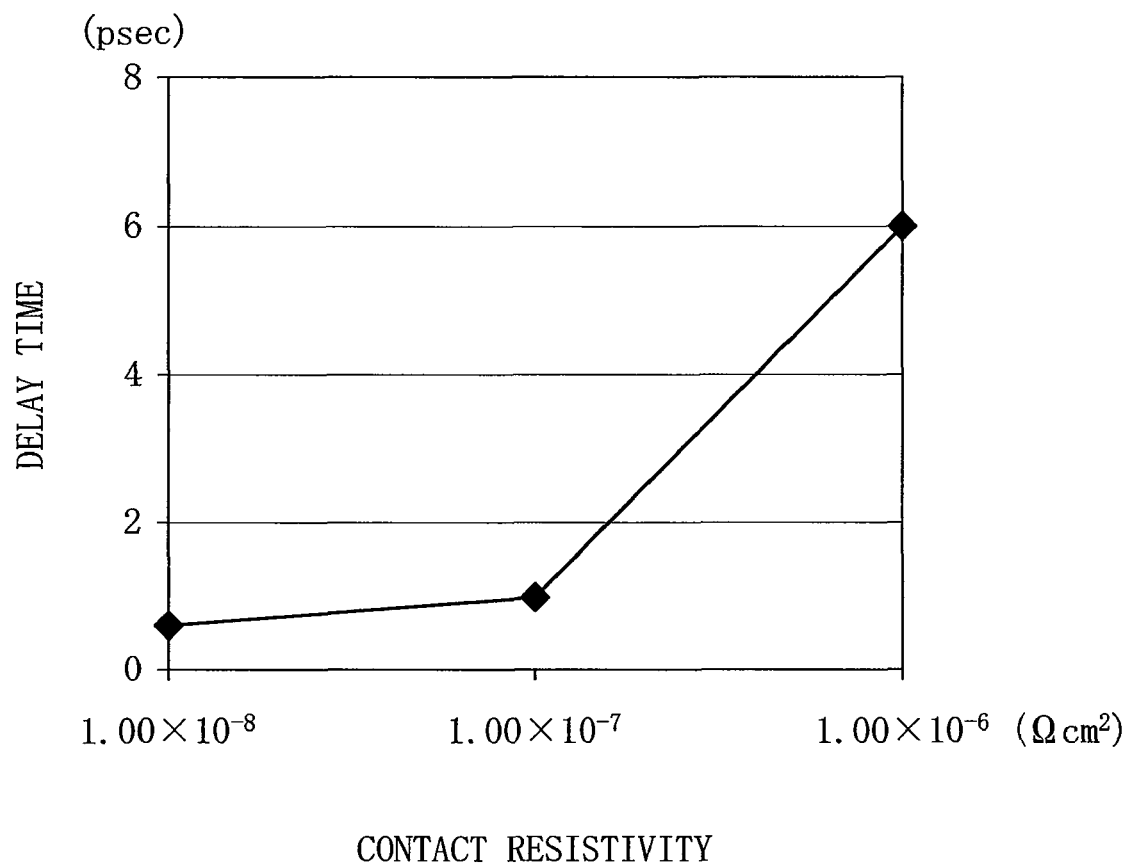
FIG. 20 is a graph showing the relationship between a value of a contact resistivity between a polysilicon film and a TiN film and a delay time in a gate electrode in the conventional metal gate of the MIPS structure.

Next, as shown in FIG. 18F, the interlayer insulating film 8 is deposited over the semiconductor substrate 1, and the upper surface of the deposited interlayer insulating film 8 is planarized by a CMP method. Subsequently, in the interlayer insulating film 8 in the boundary portion between the NFET formation region 50N and the PFET formation region 50P in the gate electrode 20, a contact hole is formed to expose the vertical portion 4a of the underlying TiN film 4. Thereafter, a Ti film is deposited by a sputtering method, and successively, a TiN film and a W film are deposited by a CVD method to fill the contact hole, thereby forming the contact 9.

In this manner, in the PFET formation region 50P, the metal gate of the MIPS structure is formed in which the contact 9 is directly connected to the TiN film 4. In the NFET formation region 50N also, the metal gate of the MIPS structure is formed which is directly connected to the contact 9 via the TiN film 4.

As described above, in the fifth example embodiment, the TiN film 4 forming the metal gate of the PFET is provided with the vertical portion 4a exposed from the second polysilicon film 11 formed on the TiN film 4. Therefore, by merely forming the contact hole only in the interlayer insulating film 8, there can be formed the semiconductor device having the NFET and the PFET each appropriate for a high-frequency operation.

Note that, in the case of forming the nickel silicide layer 7 on each of the polysilicon films 5 and 11 forming the gate electrode 20 as in the fabrication method described above, the lower end portion of the contact 9 need not necessarily be directly connected to the vertical portion 4a of the TiN film 4 as long as the lower portion of the contact 9 is directly connected to the nickel silicide layer 7.

The semiconductor device and the method for fabricating the same according to the present disclosure is useful for a semiconductor device having a metal gate having a MIPS structure or the like.

What is claimed is:

1. A semiconductor device, comprising:
   a gate insulating film formed on a first semiconductor region and a second semiconductor region which have different conductivity types;
   a first gate electrode including a first conductive film formed on the gate insulating film in the first semiconductor region;
   a second gate electrode including a first metal film and a second conductive film made of silicon that are successively formed on the gate insulating film in the second semiconductor region;
   an insulating film formed in the first semiconductor region and the second semiconductor region so as to cover the gate electrode; and
   a second metal film extending through the insulating film, and connected to the first metal film, wherein
   the first metal film has a vertical portion protruding upwardly and vertically to the second semiconductor region in a portion of the second semiconductor region to be adjacent to the first semiconductor region,
   an upper end surface of the vertical portion of the first metal film is exposed from the first conductive film and the second conductive film, and the second metal film is connected to the upper end surface of the vertical portion of the first metal film.

2. The semiconductor device of claim 1, wherein the first conductive film is made of silicon.

3. The semiconductor device of claim 1, wherein the first conductive film is a third metal film.

4. The semiconductor device of claim 1, further comprising:
a fourth metal film covering an upper surface of the first conductive film, an upper surface of the second conductive film, and the upper end surface of the vertical portion of the first metal film, wherein
the second metal film is electrically connected to the upper end surface of the vertical portion of the first metal film via the fourth metal film.

5. The semiconductor device of claim 4, wherein the fourth metal film is made of a metal silicide or a refractory metal.

6. The semiconductor device of claim 1, further comprising:
a third conductive film made of silicon and a fourth metal film that are successively formed so as to cover an upper surface of the first conductive film, an upper surface of the second conductive film, and the upper end surface of the vertical portion of the first metal film, wherein
the second metal film extends through the fourth metal film and the third conductive film and is directly connected to the upper end surface of the vertical portion of the first metal film.

7. The semiconductor device of claim 6, wherein the fourth metal film is made of a metal silicide or a refractory metal.

8. A method for fabricating a semiconductor device, comprising:
a first step of forming a gate insulating film on a semiconductor substrate having a first semiconductor region and a second semiconductor region which have different conductivity types;
a second step of selectively forming a first conductive film made of silicon on the gate insulating film in the first semiconductor region;
a third step of forming a first metal film to continuously cover an upper surface of the first conductive film in the first semiconductor region, a side surface of the first conductive film to be adjacent to the second semiconductor region, and an upper surface of the gate insulating film in the second semiconductor region therewith;
a fourth step of forming a second conductive film made of silicon on the first metal film;
a fifth step of polishing the second conductive film to expose the first conductive film and an upper end surface of a portion of the first metal film which is interposed between the first conductive film and the second conductive film and located on the side surface of the first conductive film;
a sixth step of patterning the first conductive film in the first semiconductor region to form therein a first gate electrode from the first conductive film, while patterning the second conductive film and the first metal film in the second semiconductor region to form therein a second gate electrode from the second conductive film and the first metal film;
a seventh step of forming an insulating film in the first semiconductor region and the second semiconductor region to cover the first gate electrode and the second gate electrode therewith;
an eighth step of forming a contact hole in the insulating film to expose the upper end surface of the first metal film therethrough; and
a ninth step of filling the contact hole with a second metal film so as to directly connect the second metal film to the upper end surface of the first metal film.

9. The method of claim 8, further comprising, between the first step and the second step:
a tenth step of selectively forming a third metal film on the gate insulating film in the first semiconductor region, wherein
the sixth step includes patterning the third metal film to form the first gate electrode including the first conductive film and the third metal film.

\* \* \* \* \*